US012449574B2

(12) United States Patent
Ong et al.

(10) Patent No.: US 12,449,574 B2
(45) Date of Patent: Oct. 21, 2025

(54) HIGH EFFICIENCY GRATING COUPLER FOR A LASER SOURCE (71) Applicant: Cisco Technology, Inc., San Jose, CA (US)

(72) Inventors: Eng Wen Ong, Breinigsville, PA (US); Mark A. Webster, Bethlehem, PA (US)

(73) Assignee: Cisco Technology, Inc., San Jose, CA (US)

( * ) Notice: Subject to any disclaimer, the term of this patent is extended or adjusted under 35 U.S.C. 154(b) by 1039 days.

(21) Appl. No.: 17/451,265

(22) Filed: Oct. 18, 2021

(65) Prior Publication Data

US 2023/0122662 A1   Apr. 20, 2023

(51) Int. Cl.
*G02B 5/18* (2006.01)
*H01L 21/302* (2006.01)
*H01S 5/0225* (2021.01)
*H10H 20/819* (2025.01)

(52) U.S. Cl.
CPC .......... *G02B 5/1857* (2013.01); *H01L 21/302* (2013.01); *H01S 5/0225* (2021.01); *H10H 20/819* (2025.01); *G02B 2005/1804* (2013.01)

(58) Field of Classification Search
CPC .......... G02B 5/1857; G02B 2005/1804; G02B 6/4214; H01L 21/302; H01L 33/20; H01S 5/0225
See application file for complete search history.

(56) References Cited

U.S. PATENT DOCUMENTS

| | | | |
|---|---|---|---|
| 6,993,236 B1 | 1/2006 | Gunn, III et al. | |
| 9,715,064 B1 | 7/2017 | Gambino et al. | |
| 10,459,133 B1 | 10/2019 | Liang et al. | |
| 10,816,872 B1 | 10/2020 | Bian et al. | |
| 2006/0239612 A1 | 10/2006 | De Dobbelaere et al. | |
| 2014/0193115 A1 | 7/2014 | Popovic | |
| 2020/0003956 A1* | 1/2020 | Kuo | G02B 6/4214 |

FOREIGN PATENT DOCUMENTS

WO   2012149441 A2   11/2012

OTHER PUBLICATIONS

Flory C A, "Analysis of Directional Grating-Coupled Radiation in Waveguide Structures," IEEE Journal of Quantum Electronics, IEEE, USA, vol. 40, No. 7, Dated: Jul. 1, 2004, pp. 949-957.
Zhang Huijuan et al., "High efficiency silicon nitride grating coupler," Applied Physics A, Springer Berlin Heidelberg, Berlin/Heidelberg, vol. 115, No. 1, Dated: Sep. 13, 2013, pp. 79-82.

(Continued)

*Primary Examiner* — John Bedtelyon
(74) *Attorney, Agent, or Firm* — Patterson + Sheridan, LLP (57) ABSTRACT

A grating coupler with a wafer bonded configuration includes: a substrate; an oxide layer disposed on the substrate; a silicon nitride layer disposed above the oxide layer; a first silicon layer disposed above the silicon nitride layer; a second silicon layer disposed above the first silicon layer; and a bi-layer grating disposed above the silicon nitride layer. The bi-layer grating includes (i) a first etched layer of the first silicon layer and (ii) a second etched layer of the second silicon layer.

20 Claims, 6 Drawing Sheets

(56) References Cited

OTHER PUBLICATIONS

PCT, Notification of Transmittal of The International Search Report and The Written Opinion of The International Searching Authority, or The Declaration for Application PCT/US2022/078040 dated Feb. 14, 2023.
P. Xu et al., "Fabrication-friendly high-efficiency silicon nitride grating coupler," 2017 Conference on Lasers and Electro-Optics Pacific Rim (CLEO-PR), 2017, pp. 1-3, doi: 10.1109/CLEOPR.2017.8118727.
Xu, Pengfei & Zhang, Yanfeng & Shao, Zengkai & Liu, Lin & Zhou, Lidan & Yang, Chunchuan & Chen, Yujie & Yu, Siyuan. (2017). High-efficiency wideband SiNx-on-SOI grating coupler with low fabrication complexity. Optics Letters. 42. 3391. 10.1364/OL.42.003391.
K. S. Poon, W. D. Sacher, Y. Huang and G. Lo, "Integrated photonic devices and circuits in multilayer silicon nitride-on-silicon platforms," 2015 Optical Fiber Communications Conference and Exhibition (OFC), 2015, pp. 1-3, doi: 10.1364/OFC.2015.Th3F.1.
Wesley D. Sacher, Ying Huang, Liang Ding, Benjamin J. F. Taylor, Hasitha Jayatilleka, Guo-Qiang Lo, and Joyce K. S. Poon, "Wide bandwidth and high coupling efficiency Si3N4-on-SOI dual-level grating coupler," Opt. Express 22, 10938-10947 (2014).
Jinghui Zou, Yu Yu, Mengyuan Ye, Lei Liu, Shupeng Deng, and Xinliang Zhang, "Ultra efficient silicon nitride grating coupler with bottom grating reflector," Opt. Express 23, 26305-26312 (2015).
Huijuan Zhang, Chao Li, Xiaoguang Tu, Junfeng Song, Haifeng Zhou, Xianshu Luo, Ying Huang, Mingbin Yu, and G. Q. Lo, "Efficient silicon nitride grating coupler with distributed Bragg reflectors," Opt. Express 22, 21800-21805 (2014).
Huai-Yi Chen and Kai-Chun Yang, "Design of a high-efficiency grating coupler based on a silicon nitride overlay for silicon-on-insulator waveguides," Appl. Opt. 49, 6455-6462 (2010) [Abstract Only].
A. Mekis et al., "A CMOS photonics platform for high-speed optical interconnects," IEEE Photonics Conference 2012, 2012, pp. 356-357, doi: 10.1109/IPCon.2012.6358639.
Jason C. C. Mak, Quentin Wilmart, Segolene Olivier, Sylvie Menezo, and Joyce K. S. Poon, "Silicon nitride-on-silicon bi-layer grating couplers designed by a global optimization method," Opt. Express 26, 13656-13665 (2018).
J. C. C. Mak, Q. Wilmart, S. Olivier, S. Menezo and J. K. S. Poon, "Optimization Design of Efficient Broadband Bi-Layer Grating Couplers for a Silicon Nitride-on-Silicon Foundry Platform," 2018 Optical Fiber Communications Conference and Exposition (OFC), 2018, pp. 1-3.

\* cited by examiner

HIGH EFFICIENCY GRATING COUPLER FOR A LASER SOURCE

TECHNICAL FIELD

Embodiments presented in this disclosure generally relate to grating couplers for optical chips. More specifically, embodiments disclosed herein relate to a grating coupler having a wafer-bonded configuration.

BACKGROUND

Silicon photonics has drawn increasing attention due in part to its ultra-low cost, high integration density, and compatibility with current semiconductor fabrication processes. One area of interest in silicon photonics involves the design of fiber-to-chip optical interconnects for application scenarios, such as data centers and optical transmission systems. The fiber-to-chip optical interconnects can be used to couple light on-chip (e.g., from an optical fiber to the chip) and/or couple light off-chip (e.g., from the chip to the optical fiber). Two main categories of fiber-to-chip optical interfaces include in-plane couplers (e.g., edge couplers) and out-of-plane (or off-plane or vertical) couplers (e.g., grating couplers).

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One embodiment presented in this disclosure is a grating coupler having a wafer-bonded configuration. The grating coupler includes: a substrate; an oxide layer disposed on the substrate; a silicon nitride layer disposed above the oxide layer; a first silicon layer disposed above the silicon nitride layer; a second silicon layer disposed above the first silicon layer; and a bi-layer grating disposed above the silicon nitride layer. The bi-layer grating includes a first etched layer of the first silicon layer and a second etched layer of the second silicon layer.

Another embodiment presented in this disclosure is a method for fabricating a grating coupler with a wafer bonded configuration. The method includes forming a first wafer structure. Forming the first wafer structure includes forming a first silicon layer above a substrate, forming a second silicon layer above the first silicon layer, and forming a silicon nitride layer above the second silicon layer. The method also includes forming a bi-layer grating within the first wafer structure. Forming the bi-layer grating within the first wafer structure includes forming a first etched layer of the first silicon layer and forming a second etched layer of the second silicon layer. The method further includes wafer bonding the first wafer structure to a second wafer structure, such that the first etched layer is disposed above the second etched layer and the silicon nitride layer.

Another embodiment presented in this disclosure is an optical apparatus. The optical apparatus includes a semiconductor chip, a grating coupler disposed on the semiconductor chip, and a laser configured to output a light beam that is vertically incident onto the grating coupler. The grating coupler is configured to couple the light beam output from the laser onto the semiconductor chip. The grating coupler includes: a substrate; an oxide layer disposed on the substrate; a silicon nitride layer disposed above the oxide layer; a first silicon layer disposed above the silicon nitride layer; a second silicon layer disposed above the first silicon layer; and a bi-layer grating disposed above the silicon nitride layer. The bi-layer grating includes a first etched layer of the first silicon layer and a second etched layer of the second silicon layer.

EXAMPLE EMBODIMENTS

Grating couplers can be used for coupling light on to a chip (e.g., on-chip) (or semiconductor wafer) and/or for coupling light off a chip (e.g., off-chip). Grating couplers are generally used in vertical coupling configurations (e.g., out-of-plane coupling scenarios), where the optical fiber is placed above the grating coupler (which is disposed on the semiconductor chip) vertically or slanted at a certain degree to meet a desired coupling efficiency. In these vertical coupling configurations, the light beam from the optical fiber is typically incident from the top surface of the semiconductor chip. The grating coupler can modify the k-vector direction of the incident light beam, allowing coupling of light into the semiconductor chip.

Figure 1:
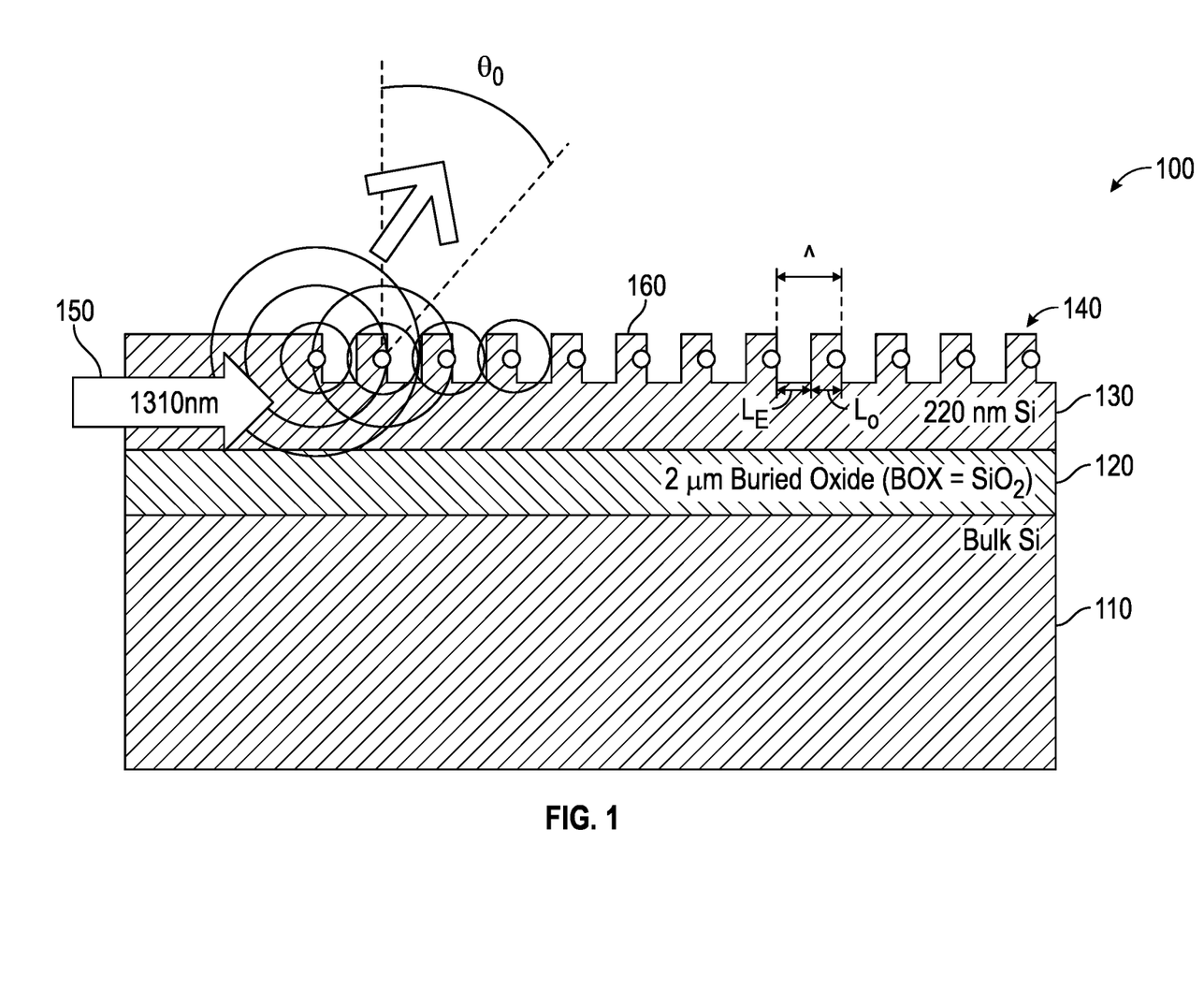
FIG. 1 illustrates a cross-sectional view of an example grating coupler.

FIG. 1 illustrates a cross-sectional view of an example grating coupler 100. The grating coupler 100 has a silicon on insulator (SOI) architecture. For example, the grating coupler 100 has a semiconductor structure, which includes a silicon (Si) substrate 110 (e.g., Bulk Si), a Si layer 130, and a buried oxide layer 120 (e.g., silicon dioxide ($SiO_2$)) disposed between the Si substrate 110 and the Si layer 130. The Si layer 130 may have a smaller thickness than the Si substrate 110. The grating coupler 100 includes a grating structure 140, which is composed of multiple scattering units (or teeth) 160 formed by partially etching the Si layer 130. The grating period Λ is the length of each scattering unit 160 which is equal to the sum of the length of an etched trench (e.g., $L_E$) and the length of an unetched tooth (e.g., $L_O$).

Grating couplers, such as the grating coupler 100, operate according to the Bragg Diffraction principle, shown in Equation (1) below:

$$\sin\theta_0 = \frac{n_{\mathit{eff}}^{\mathit{grat}}}{n} + m\frac{\lambda_0}{n\Lambda} \qquad (1)$$

where $\theta_0$ is the diffraction angle, $n_{\mathit{eff}}^{\mathit{grat}}$ is the wavelength dependent, averaged refractive index of the grating, n is the refractive index of the medium in which the diffracted wave is propagating, $\lambda_0$ is the vacuum wavelength, $\Lambda$ is the grating period, and m is the diffraction order integer.

Under the Bragg Diffraction principle, as the incident light beam 150 (e.g., from the semiconductor chip) (e.g., travelling in the x direction) hits a series of scattering units 160 with a period close to the wavelength of the light beam 150, the wavefront off each individual scattering unit 160 may constructively interfere to produce a primary scattered wavefront travelling in a different direction. The grating coupler 100 can be used to maximize the constructive interference of the upwards travelling wavefront, while minimizing the downwards travelling wavefront. The angle of the upwards wave is generally the diffraction angle, $\theta_0$ (also referred to as the coupling angle). The coupling angle may be tuned by the grating period, $\Lambda$. Note that while FIG. 1 illustrates an example of the grating coupler 100 for coupling light off-chip, those of ordinary skill in the art will understand that the grating coupler 100 can operate similarly for coupling light on-chip.

Figure 2:
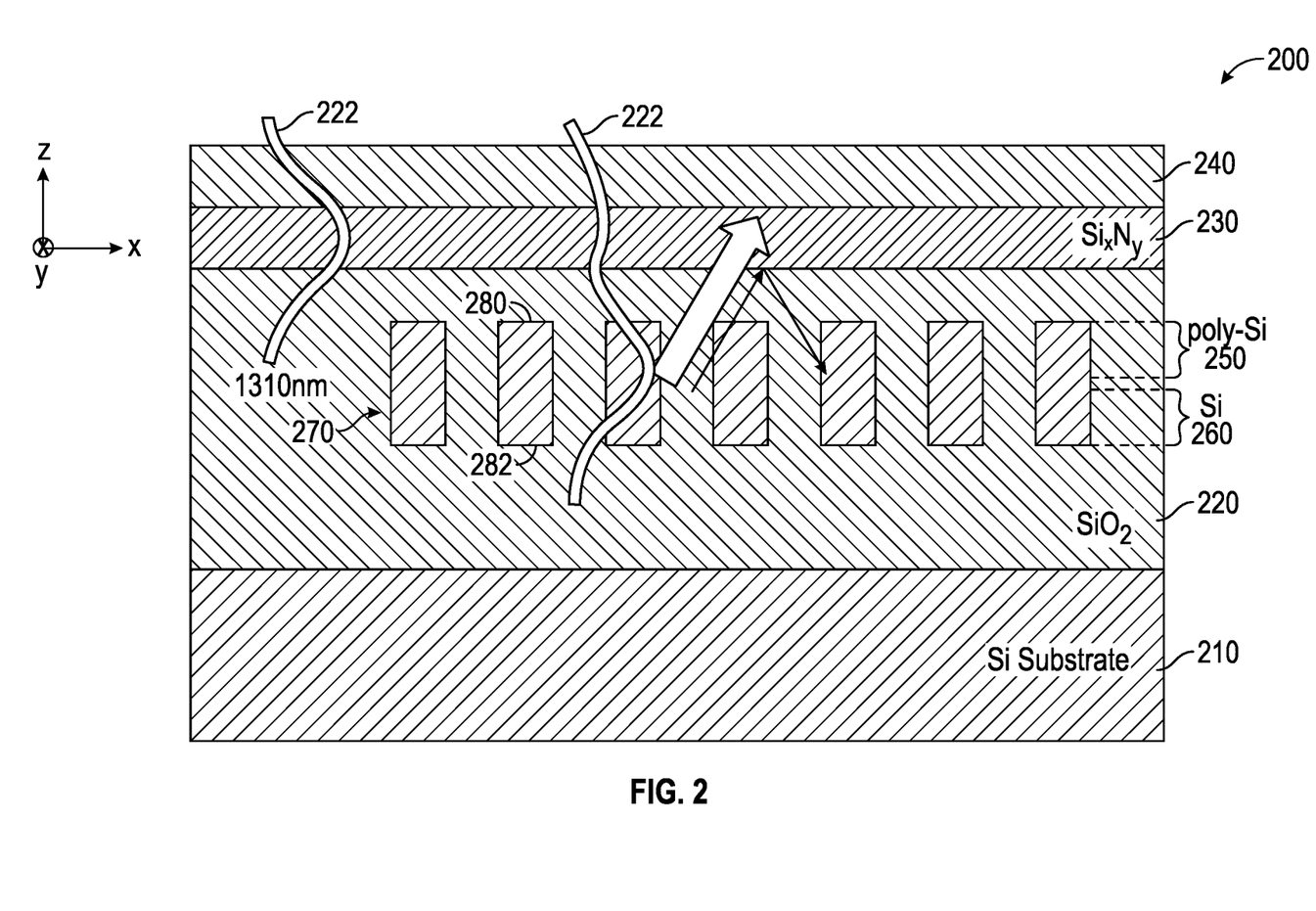
FIG. 2 illustrates a cross-sectional view of an example grating coupler with a non-wafer bonded configuration.

Conventional photonic platforms generally use grating couplers that have a non-wafer bonded configuration. FIG. 2 illustrates an example grating coupler 200 with a non-wafer bonded configuration. The grating coupler 200 may be based on a SOI wafer substrate. For example, the grating coupler 200 includes a Si substrate 210, an (interlayer) oxide layer 220 (e.g., SiO$_2$), a nitride layer 230 (e.g., silicon nitride (Si$_x$N$_y$)), an oxide layer 240, a (monocrystalline) silicon etched layer 260 (e.g., Si), and a (polycrystalline) silicon etched layer 250 (also referred to as polysilicon etched layer) (e.g., poly-Si).

The grating coupler 200 may be formed by starting with an SOI wafer, then etching the monocrystalline Si layer of the SOI wafer, then depositing polycrystalline silicon on (the monocrystalline Si layer of) the SOI wafer, then depositing interlayer oxide (e.g., SiO$_2$), then depositing polycrystalline silicon nitride (Si$_x$N$_y$) on the polycrystalline silicon, and then depositing additional interlayer oxide (e.g., SiO$_2$). The silicon etched layer 260 may be formed by etching the monocrystalline Si layer of the SOI wafer. The polysilicon etched layer 250 may be formed by etching the deposited polycrystalline silicon. The nitride layer 230 may be a first nitride layer of the deposited polycrystalline silicon nitride. In some cases, the nitride layer 230 may be formed by etching the deposited polycrystalline silicon nitride.

The grating coupler 200 includes a grating structure 270, which includes a set of scattering units 280 and a set of scattering units 282. The set of scattering units 280 are disposed above the set of scattering units 282. For example, the set of scattering units 280 may be formed in the polysilicon etched layer 250. That is, the set of scattering units 280 may include unetched portions of the deposited polycrystalline silicon. Similarly, the set of scattering units 282 may be formed in the silicon etched layer 260. That is, the set of scattering units 282 may include unetched portions of the monocrystalline Si layer of the SOI wafer.

One issue with using a non-wafer bonded configuration for a grating coupler, such as the grating coupler 200, is that the non-wafer bonded configuration can lead to less efficient coupling of light off-chip (or on-chip). For example, conventional grating couplers, such as the grating coupler 200, generally couple to the silicon etched layer 260. The grating coupler 200 can then use an interlayer taper (e.g., SE-FN interlayer taper) to couple to the nitride layer 230. However, this may introduce an insertion loss and limit the power transferable, due to the high concentration of the E-field (from the incident light beam 222) at the silicon etched layer 260. For example, as shown in FIG. 2, the E-field intensity (from the light beam 222) is localized in the polysilicon etched layer 250 and silicon etched layer 260. However, due to the destructive reflection off the nitride layer 230, less power may be scattered upwards. This in turn can reduce the amount of light that can be coupled off-chip. Note that while FIG. 2 illustrates an example of the grating coupler 200 for coupling light off-chip, those of ordinary skill in the art will understand that the grating coupler 200 can operate similarly for coupling light on-chip.

Accordingly, embodiments described herein provide a high-efficiency grating coupler that has a wafer bonded configuration. The grating coupler described herein can significantly increase the amount of light that is coupled off-chip or coupled on-chip.

Figure 3:
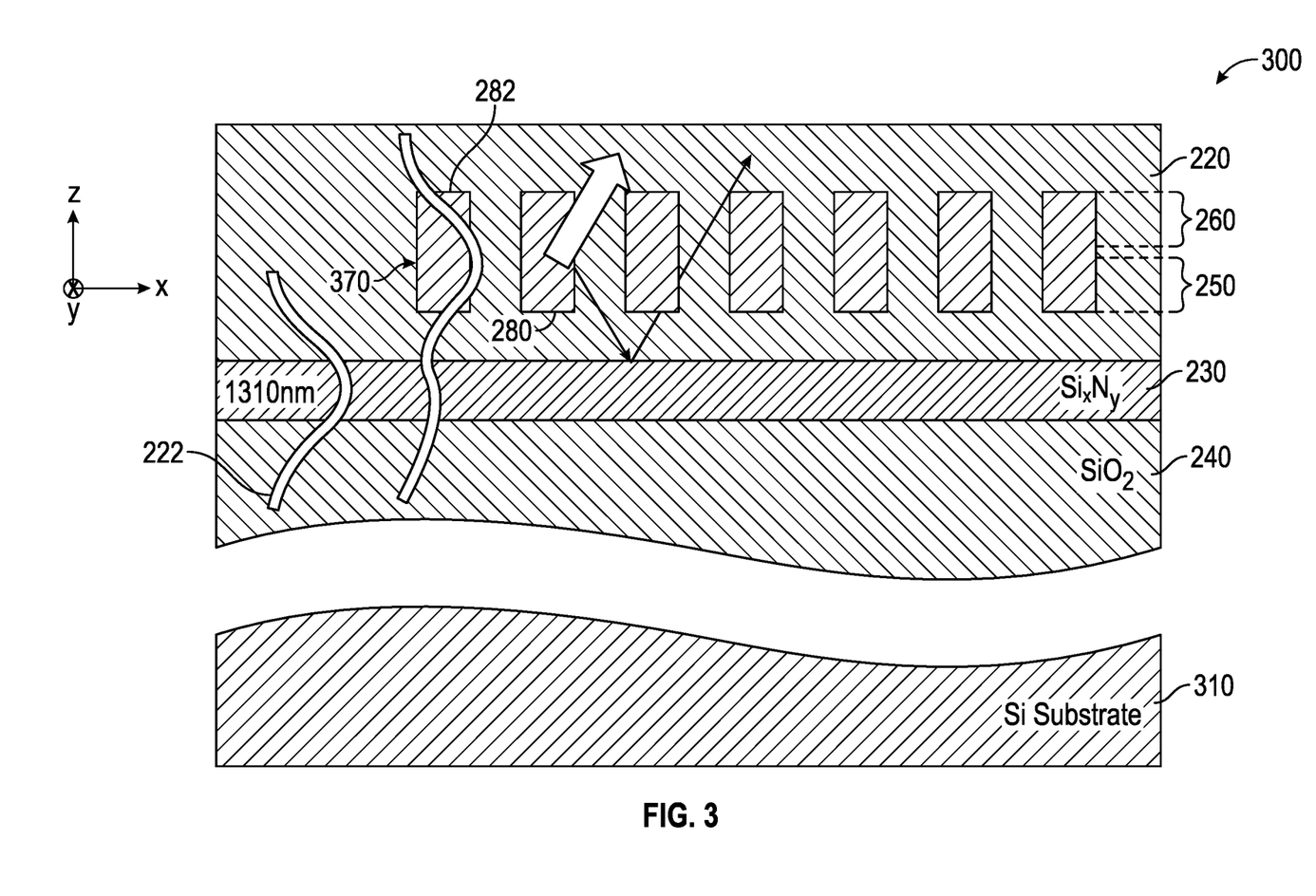
FIG. 3 illustrates a cross-sectional view of an example grating coupler with a wafer bonded configuration, according to one embodiment.

FIG. 3 illustrates an example grating coupler 300 with a wafer bonded configuration, according to one embodiment. The grating coupler 300 includes an Si substrate 310, an oxide layer 240 (e.g., SiO$_2$), a nitride layer 230 (e.g., Si$_x$N$_y$), an oxide layer 220 (e.g., SiO$_2$), a silicon etched layer 260, and a polysilicon etched layer 250.

Similar to the grating coupler 200, the grating coupler 300 may be formed by starting with an SOI wafer, then etching the monocrystalline Si layer of the SOI wafer, then depositing and etching polycrystalline silicon on (the monocrystalline Si layer of) the SOI wafer, then depositing interlayer oxide (e.g., SiO$_2$), then depositing and etching polycrystalline silicon nitride (Si$_x$N$_y$) on the polycrystalline silicon, and then depositing additional interlayer oxide (e.g., SiO$_2$). Similar to FIG. 2, in the grating coupler 300, the silicon etched layer 260 may be formed by etching the monocrystalline Si layer of the SOI wafer. The polysilicon etched layer 250 may be formed by etching the deposited polycrystalline silicon. The nitride layer 230 may be a first nitride layer of the deposited polycrystalline silicon nitride and may be formed by etching the deposited polycrystalline silicon nitride.

Compared to the grating coupler 200, after depositing (and etching) the polycrystalline silicon nitride, the grating coupler 300 may be flipped and wafer-bonded to another photonic wafer, such that (i) the silicon etched layer 260 is disposed above the polysilicon etched layer 250 and the nitride layer 230 and (ii) the polysilicon etched layer 250 is disposed above the nitride layer 230. After this wafer bonding step, at least a portion of SOI wafer (e.g., the substrate 210 of the SOI wafer) may be ground away to expose the oxide layer 220.

The silicon etched layer 260 and the polysilicon etched layer 250 may each have a higher refractive index than the nitride layer 230. Additionally, the silicon etched layer 260 may have a higher refractive index than the polysilicon etched layer 250. The grating coupler 300 also includes a grating structure 370, which is a bi-layer grating that includes the set of scattering units 282 and the set of scattering units 280. Compared to the grating structure 270, in the grating structure 370, the set of scattering units 282 are disposed above the set of scattering units 280.

With the wafer-bonded configuration shown in FIG. 3, the E-field intensity (from the light beam 222 as it traverses the grating region) may localize in the higher refractive index silicon etched layer 260 and polysilicon etched layer 250. Additionally, due to the constructive reflection off the nitride layer 230, more power may be scattered upwards (relative to the non-wafer bonded configuration shown in FIG. 2). Accordingly, by etching gratings in the silicon etched layer 260 and polysilicon etched layer 250 in an upside down wafer-bonded configuration, the directionality and efficiency of the grating coupler can be significantly higher than in the non-wafer bonded configuration.

Figure 4:
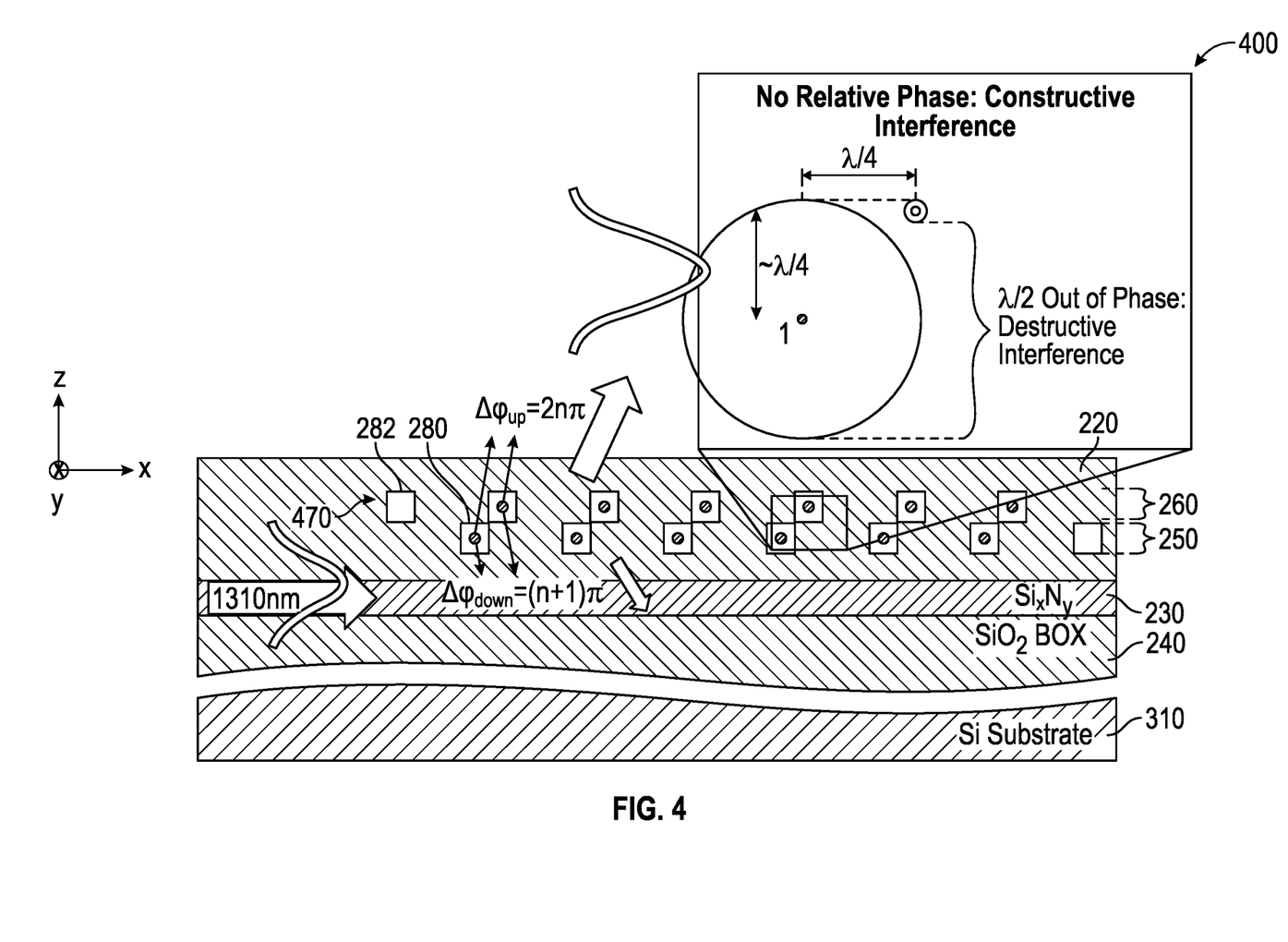
FIG. 4 illustrates a cross-sectional view of another example grating coupler with a wafer bonded configuration, according to one embodiment.

FIG. 4 illustrates another example grating coupler 400 with a wafer bonded configuration, according to one embodiment. Similar to the grating coupler 300, the grating coupler 400 includes a grating structure 470, which is a bi-layer grating that includes the set of scattering units 282 and the scattering units 280. Compared to the grating coupler 300, in the grating coupler 400, the set of scattering units 282 are displaced laterally from the set of scattering units 280 (e.g., by a factor of a wavelength of the light beam 222 propagating through the grating coupler 400). In one embodiment, the scattering units 282 and the scattering units 280 can be displaced laterally by $\lambda/4$ (where $\lambda$ is the wavelength of the light beam 222 in the medium and the factor is ¼) in order to create a phased array antenna effect that allows for steering the light beam 222.

For example, as shown in FIG. 4, as the light beam 222 propagates towards the grating region, the outgoing E-field may initially scatter off the bottom polysilicon etched layer 250, since the polysilicon etched layer 250 is displaced forward by $\lambda/4$. This scattering event may then produce a wavefront in all directions. For example, after scattering off the bottom polysilicon etched layer 250, the wavefront may then scatter off the top silicon etched layer 260 $\lambda/4$ later. At that point, the upwards-moving wavefront from the polysilicon etched layer scattering unit may be in-phase with the upwards-moving wavefront of the silicon etched layer scattering unit. This can lead to constructive interference upwards. In contrast, the downwards-moving wavefront off the polysilicon etched layer scattering unit may be $\lambda/2$ out of phase with the downwards-moving wavefront off the silicon etched layer scattering unit, leading to destructive interference downwards.

Additionally or alternatively, in some embodiments, a negative coupling angle can be used for the grating couplers in the wafer-bonded configurations (e.g., grating coupler 300, grating coupler 400). In conventional grating couplers, positive coupling angles (as opposed to negative coupling angles) are generally used to reduce higher order radiated modes and obtain a higher coupling efficiency. A negative coupling angle, for example, may use a larger grating period, $\Lambda$, and therefore may have a higher bandwidth. Thus, because grating couplers with non-wafer bonded configurations may have weak grating strengths, using a negative coupling angle can result in lower coupling efficiency, e.g., due to the weaker grating strength.

However, by using the silicon etched and polysilicon etched layers as the diffracting layers (as in grating coupler 300 and grating coupler 400), a grating coupler with a higher grating strength can be obtained. This in turn may allow for negative coupling angles to be used and may allow for a longer grating period, leading to a broader bandwidth. In one particular embodiment, the coupling angle is −13 degrees.

As noted above, the grating coupler described herein can be used in vertical coupling configurations for coupling light on-chip and off-chip. In some embodiments, the grating coupler described herein can be used with laser sources, such as a laser micro package (LaMP). LaMPs can be used as a laser source for transceivers and include a family of laser packages, with different wavelengths, power requirements, internals, costs, etc.

Figure 5:
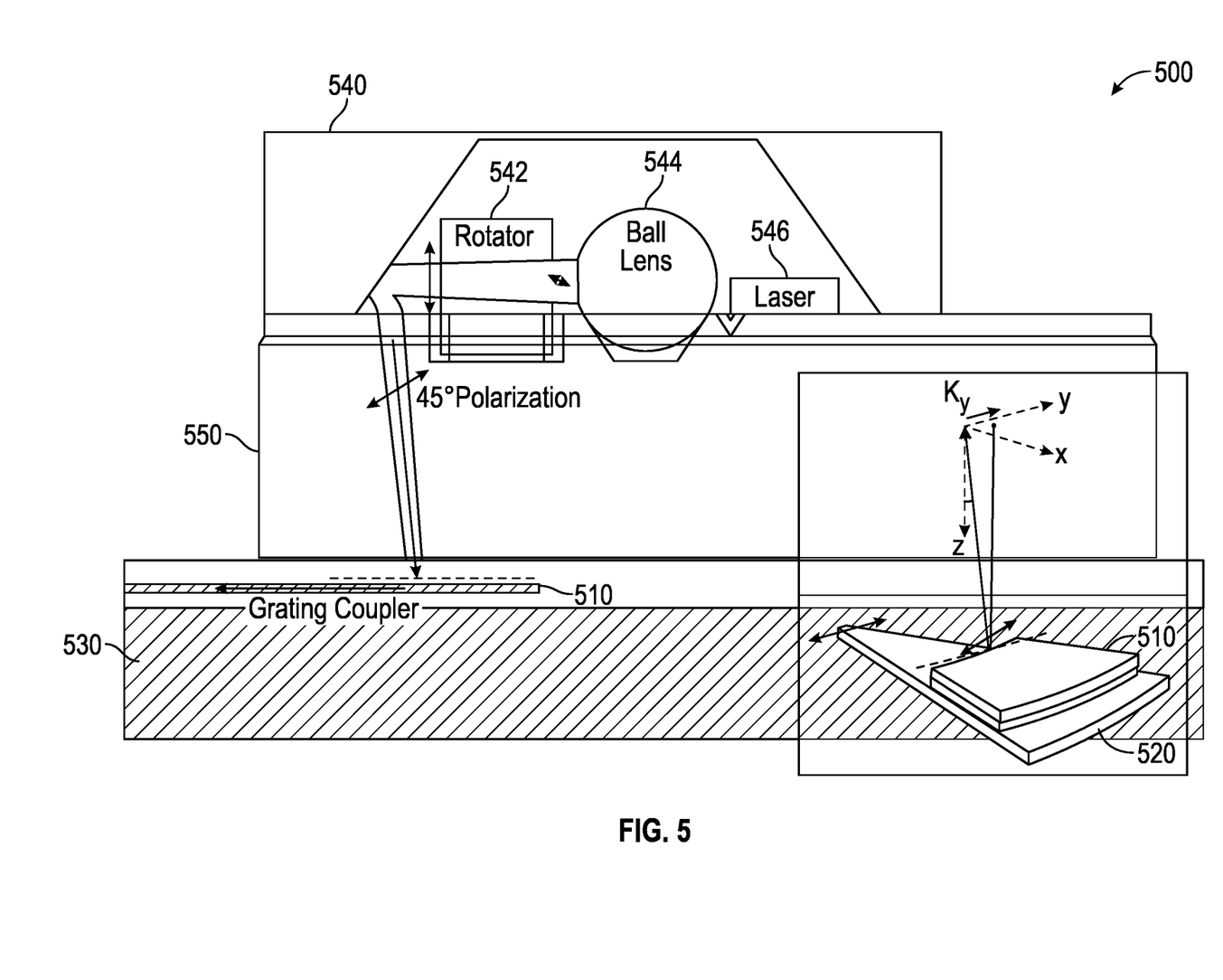
FIG. 5 illustrates an example laser micro package, according to one embodiment.

FIG. 5 illustrates an example of a LaMP 500, according to one embodiment. The LaMP 500 may be direct attached to a photonic wafer (e.g., semiconductor wafer 530). The LaMP 500 includes a lid structure 540, a base structure 550, and a grating coupler 510. The lid structure 540 includes a rotator 542 (also referred to as a polarization rotator), ball lens 544, and a laser 546. The grating coupler 510 may be disposed on a silicon waveguide 520, which is disposed on the semiconductor wafer 530.

In one embodiment, the laser 546 may generate a laser that exits out the base structure 550 and is vertically incident on the grating coupler 510. In some cases, because the LaMP 500 may not have a waveplate after the rotator 542, the polarization of the beam exiting the LaMP 500 may be rotated 45° into the screen, and tilted with respect to the x-y plane. In these embodiments, the grating coupler 510 may have to be rotated a certain number of degrees into the screen to adapt to the polarization angle.

Figure 6:
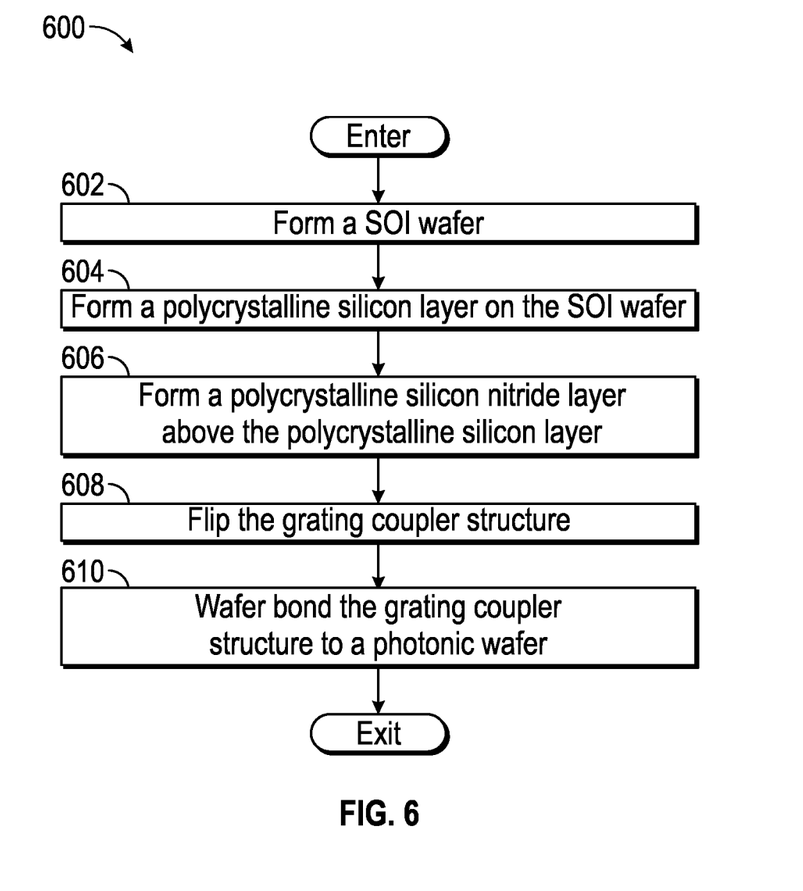
FIG. 6 is a flowchart of a method for fabricating a grating coupler with a wafer bonded configuration, according to one embodiment.

FIG. 6 is a flowchart of a method 600 for fabricating a grating coupler (e.g., grating coupler 300, grating coupler 400) having a wafer bonded configuration, according to one embodiment. The method 600 may be performed, for example, by a semiconductor processing chamber.

Method 600 enters at block 602, where a SOI wafer is formed. The SOI wafer, for example, can include a substrate (e.g., Si substrate 110 or 210), an oxide layer (e.g., oxide layer 120 or 220), and a Si layer (e.g., Si layer 130). In some aspects, the monocrystalline silicon layer (e.g., Si layer 130) of the SOI wafer may be etched to form a silicon etched layer (e.g., silicon etched layer 260).

At block 604, a polycrystalline silicon layer is formed (e.g., deposited) on the SOI wafer. For example, the polycrystalline silicon layer may be formed on the (etched) monocrystalline silicon layer (e.g., Si layer 130) of the SOI wafer. The polycrystalline silicon layer may be deposited using gas precursors. In some aspects, the polycrystalline silicon layer formed on the SOI wafer may be etched to form a polysilicon etched layer (e.g., polysilicon etched layer 250). In some aspects, an interlayer oxide (e.g., $SiO_2$) may be formed on top of the polysilicon etched layer.

At block 606, a polycrystalline silicon nitride layer (e.g., nitride layer 230) is formed (e.g., deposited) above the (etched) polycrystalline silicon layer. For example, the polycrystalline silicon nitride layer may be formed on top of the interlayer oxide, which is formed on top of the (etched) polycrystalline silicon layer. The polycrystalline silicon nitride layer may be deposited using gas precursors. In some aspects, the polycrystalline silicon nitride layer may be etched to form an etched polycrystalline silicon nitride layer. In some aspects, an additional interlayer oxide (e.g., $SiO_2$) may be formed on top of the (etched) polycrystalline silicon nitride layer.

At block 608, the grating coupler structure formed with blocks 602, 604, and 606 is flipped (e.g., upside down), such that (i) the (etched) monocrystalline Si layer is disposed above the (etched) polycrystalline silicon layer and the (etched) polycrystalline silicon nitride layer and (ii) the (etched) polycrystalline silicon layer is disposed above the (etched) polycrystalline silicon nitride layer. At block 610, the flipped grating coupler structure is wafer bonded to a photonic wafer (e.g., substrate 310). In some aspects, after the flipped grating coupler structure is wafer bonded to the photonic wafer, the top substrate (e.g., substrate 210) of the SOI wafer may be ground away to expose the oxide layer (e.g., oxide layer 220) of the SOI wafer.

In some aspects, the flipped grating coupler structure may include a grating structure (e.g., grating coupler structure 370), which includes a first set of scattering units (e.g., scattering units 282) disposed above a second set of scattering units (e.g., scattering units 280). In some aspects, the first set of scattering units may be laterally displaced from the second set of scattering units. In some aspects, the first set of scattering units may be laterally aligned with the second set of scattering units.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The flowchart illustrations and block diagrams in the Figures illustrate the architecture, functionality, and operation of possible implementations of systems, and methods according to various embodiments. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A grating coupler having a wafer-bonded configuration, the grating coupler comprising:
    a substrate;
    an oxide layer disposed on the substrate;
    a silicon nitride layer disposed above the oxide layer;
    a polycrystalline silicon layer disposed above the silicon nitride layer;
    a monocrystalline silicon layer disposed above the polycrystalline silicon layer; and
    a bi-layer grating disposed above the silicon nitride layer, the bi-layer grating comprising:
        a first etched layer of the polycrystalline silicon layer; and
        a second etched layer of the polycrystalline silicon layer.

2. The grating coupler of claim 1, wherein:
    the first etched layer comprises a first plurality of scattering units; and
    the second etched layer comprises a second plurality of scattering units.

3. The grating coupler of claim 2, wherein the first plurality of scattering units are laterally aligned with the second plurality of scattering units.

4. The grating coupler of claim 2, wherein the first plurality of scattering units are displaced laterally with respect to the second plurality of scattering units.

5. The grating coupler of claim 4, wherein at least one of the first plurality of scattering units is laterally displaced by a factor of a wavelength of a light beam propagating through the grating coupler.

6. The grating coupler of claim 5, wherein the factor is ¼.

7. The grating coupler of claim 1, wherein a coupling angle between the grating coupler and an optical fiber disposed above the grating coupler is negative.

8. The grating coupler of claim 7, wherein the coupling angle is −13 degrees.

9. The grating coupler of claim 1, wherein: the first etched layer comprises a polysilicon etch of the polycrystalline silicon layer.

10. The grating coupler of claim 1, wherein: the second etched layer comprises a silicon etch of the monocrystalline silicon layer.

11. A method for fabricating a grating coupler with a wafer bonded configuration, the method comprising:
    forming a first wafer structure, comprising:
        forming a monocrystalline silicon layer above a substrate;
        forming a polycrystalline silicon layer above the monocrystalline silicon layer; and
        forming a silicon nitride layer above the polycrystalline silicon layer;
    forming a bi-layer grating within the first wafer structure, comprising:
        forming an etched layer of the monocrystalline silicon layer; and
        forming an etched layer of the polycrystalline silicon layer; and
    wafer bonding the first wafer structure to a second wafer structure, such that the etched layer of the monocrystalline silicon layer is disposed above the etched layer of the polycrystalline silicon layer and the silicon nitride layer.

12. The method of claim 11, wherein:
    forming the etched layer of the monocrystalline silicon layer comprises forming a first plurality of scattering units; and
    forming the etched layer of the polycrystalline silicon layer comprises forming a second plurality of scattering units.

13. The method of claim 12, wherein the first plurality of scattering units are laterally aligned with the second plurality of scattering units.

14. The method of claim 12, wherein the first plurality of scattering units are displaced laterally with respect to the second plurality of scattering units.

15. The method of claim 14, wherein at least one of the first plurality of scattering units is laterally displaced by a factor of a wavelength of a light beam propagating through the grating coupler.

16. The method of claim 15, wherein the factor is ¼.

17. The method of claim 11, wherein a coupling angle between the grating coupler and an optical fiber disposed above the grating coupler is negative.

18. The method of claim 11, wherein: the etched layer of the monocrystalline silicon layer comprises a silicon etch of the monocrystalline silicon layer.

19. The method of claim 11, wherein: the etched layer of the polycrystalline silicon layer comprises a polysilicon etch of the polycrystalline silicon layer.

20. An optical apparatus comprising:
   a semiconductor chip;
   a grating coupler disposed on the semiconductor chip; and
   a laser configured to output a light beam that is vertically incident onto the grating coupler, wherein the grating coupler (i) is configured to couple the light beam output from the laser onto the semiconductor chip and (ii) comprises:
      a substrate;
      an oxide layer disposed on the substrate;
      a silicon nitride layer disposed above the oxide layer;
      a polycrystalline silicon layer disposed above the silicon nitride layer;
      a polycrystalline silicon layer disposed above the first polycrystalline silicon layer; and
      a bi-layer grating disposed above the silicon nitride layer, the bi-layer grating comprising:
         a first etched layer of the polycrystalline silicon layer; and
         a second etched layer of the polycrystalline silicon layer.

* * * * *